United States Patent [19]
Funhoff et al.

[11] Patent Number: 5,914,219
[45] Date of Patent: *Jun. 22, 1999

[54] RADIATION-SENSITIVE MIXTURE AND THE PRODUCTION OF RELIEF STRUCTURES HAVING IMPROVED CONTRAST

[75] Inventors: Dirk Funhoff, Heidelberg; Reinhold Schwalm, Wachenheim; Horst Binder, Lamppertheim, all of Germany

[73] Assignee: BASF Aktiengesellschaft, Ludwigshafen, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/735,114

[22] Filed: Oct. 22, 1996

Related U.S. Application Data

[60] Continuation of application No. 08/498,839, Jul. 6, 1995, abandoned, which is a division of application No. 08/203,021, Feb. 28, 1994, abandoned.

[30] Foreign Application Priority Data

Mar. 1, 1993 [DE] Germany .............................. 43 06 069

[51] Int. Cl.$^6$ ................ G03F 7/38; G03F 7/40; G03F 7/039
[52] U.S. Cl. ..................... 430/326; 430/270.1; 430/330; 430/910; 430/921; 522/31
[58] Field of Search ................ 430/270.1, 326, 430/330, 905, 910, 921; 522/31

[56] References Cited

U.S. PATENT DOCUMENTS

| | | |
|---|---|---|
| 4,442,197 | 4/1984 | Crivello et al. ...................... 430/280.1 |
| 4,603,101 | 7/1986 | Crivello ............................... 430/270.1 |
| 5,034,305 | 7/1991 | Nguyen-Kim et al. ............... 430/270.1 |
| 5,258,257 | 11/1993 | Sinta et al. ............................. 430/192 |
| 5,320,931 | 6/1994 | Umehara et al. .................... 430/270.1 |
| 5,525,453 | 6/1996 | Przybilla et al. ....................... 430/170 |
| 5,712,078 | 1/1998 | Huang et al. ........................ 430/270.1 |

FOREIGN PATENT DOCUMENTS 4-51243  2/1992  Japan ..................................... 430/270

OTHER PUBLICATIONS

Patent & Trademark Office English–Language Translation of Japanese Patent 4–51243 (Pub. Feb. 1992).
CAS Registry RN 124–41–4.

*Primary Examiner*—Janis L. Dote
*Attorney, Agent, or Firm*—Keil & Weinkauf

[57] ABSTRACT

Positive-working radiation-sensitive mixtures, essentially consisting of (a1) a water-insoluble organic binder which contains acid-labile groups and is rendered soluble in aqueous alkaline solutions by the action of an acid, or (a2.1) a polymeric binder which is insoluble in water but soluble in aqueous alkaline solutions and (a2.2) an organic compound whose solubility in an aqueous alkaline developer is increased by the action of an acid, and (b) an organic compound which produces an acid under the action of actinic radiation, which additionally contain (c) a strongly basic organic compound having hydroxide, alkoxide or phenoxide anions, are suitable for the production of relief structures having improved contrast.

12 Claims, No Drawings

RADIATION-SENSITIVE MIXTURE AND THE PRODUCTION OF RELIEF STRUCTURES HAVING IMPROVED CONTRAST

This application is a continuation of application Ser. No. 08/498,839, filed on Jul. 6, 1995, now abandoned, which is a division of Ser. No. 08/203,021, filed Feb. 28, 1994, now abandoned.

The present invention relates to positive-working radiation-sensitive mixtures which contain acid-labile groups and photoactive components and are sensitive to actinic radiation and whose contrast is improved by the addition of strong bases. These radiation-sensitive mixtures are particularly suitable as resist materials for one-layer resists for the production of relief patterns.

The present invention relates in particular to positive-working radiation-sensitive mixtures which are known per se and are based on the principle of chemical intensification. The species is produced in a primary photochemical reaction, triggers a catalytic secondary reaction regardless of the radiation and thus dramatically increases the sensitivity. Such systems which photo-chemically produce a strong acid which then cleaves acid-labile groups in a secondary reaction are disclosed in, for example, U.S. Pat. Nos. 3,923,514 and 3,915,706 and DE-A 34 06 927.

The contrast of such resists, ie. the crispness in the differentiation between the unexposed and the exposed parts, is an important performance characteristic. Processes for improving the contrast are therefore always desirable.

It is an object of the present invention to provide a radiation-sensitive mixture which gives improved contrast when it is processed to give relief structures.

We have found that, in the case of positive-working radiation-sensitive mixtures, this object is achieved, surprisingly, with the addition of strong bases.

This is all the more surprising since it is known that even small amounts of bases from the air have a substantial adverse effect on the quality of reproduction (cf. for example S. A. MacDonald, N. J. Clecak, H. R. Wendt, C. G. Willson, C. D. Snyder, C. J. Knors, N. B. Deyoe, J. G. Maltabes, J. R. Morrow, A. E. McGuire and S. J. Holmes, Proc. SPIE 2 (1991), 1466; W. D. Hinsberg, S. A. MacDonald, N. J. Clecak and C. D. Snyder, Proc. SPIE 24 (1992), 1672; O. Nalamasu, E. Reichmanis, M. Cheng, V. Pol. J. M. Kometani, F. M. Houlihan, T. X. Neenan, M. P. Bohrer, D. A. Mixon and L. F. Thompson, Proc. SPIE 13 (1991), 1466. U.S. Pat. No. 4,775,609 even recommends the use of bases for reversing positive resists, ie. for the production of negative images of positive-working resists, exactly the opposite of what is usually expected from a positive-working radiation-sensitive mixture.

The present invention therefore relates to positive-working radiation-sensitive mixtures, essentially consisting of (a1) a water-insoluble organic binder which contains acid-labile groups and is rendered soluble in aqueous alkaline solutions by the action of an acid, or (a2.1) a polymeric binder which is insoluble in water but soluble in aqueous alkaline solutions and (a2.2) an organic compound whose solubility in an aqueous alkaline developer is increased by the action of an acid, and (b) an organic compound which produces an acid under the action of actinic radiation, wherein (c) at least one strongly basic organic compound having hydroxide, alkoxide or phenoxide anions is additionally present.

Particularly suitable basic compounds (c) are organic basic compounds having a $PK_b$ of <2.5, preferably quaternary ammonium hydroxides, alkoxides or phenoxides.

Component (c) is present in the novel radiation-sensitive mixture in amounts of from 0.01 to 50, preferably from 1 to 20, mol %, based on component (b).

Preferred components (b) are sulfonium or iodonium salts of the general formula (I) or (II)

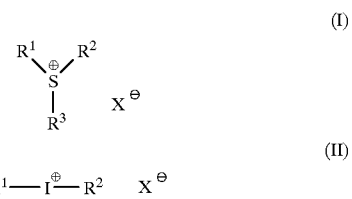

where $R^1$, $R^2$ and $R^3$ are identical or different and are each alkyl, oxaalkyl, aryl, alkyl- or alkoxy-substituted aryl, aralkyl or a radical

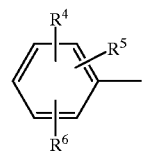

where $R^4$, $R^5$ and $R^6$ are identical or different and are each H, OH, halogen, alkyl or alkoxy, and $X^\ominus$ is a nonnucleophilic counter-ion.

Sulfonium salts of the general formula (III)

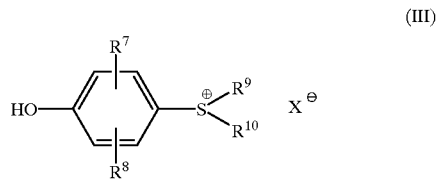

where $R^7$ and $R^8$ are identical or different and are each H, OH, alkyl or alkoxy, $R^9$ and $R^{10}$ are identical or different and are each alkyl of 1 to 18 carbon atoms and $X^\ominus$ is a nonnucleophilic counter-ion, are also preferred.

Other preferred components (b) are sulfonium salts of the general formula (IV)

where $R^{11}$, $R^{12}$ and $R^{13}$ are identical or different and are each alkyl, oxaalkyl, aryl, alkyl- or alkoxy-substituted aryl or aralkyl, or two of the radicals $R^{11}$ to $R^{13}$ are bonded to one another to form a ring, with the proviso that at least one of the radicals $R^{11}$ to $R^{13}$ contains at least one acid-cleavable group, it being possible for one of the radicals $R^{11}$ to $R^{13}$ to be bonded, if necessary via acid-cleavable groups, to one or more further sulfonium salt radicals, and $X^\ominus$ is a nonnucleophilic counter-ion.

The components (a1) or (a2.1) and (a2.2) may contain acid-labile ether, ester, acetal, ketal or carbonate groups.

In particular, polymers or copolymers which contain, as monomer units, tert-butoxystyrene, tert-butoxycarbonylutyrene, tetrahydropyranyloxystyrene, tert-butyldimethylsilyloxystyrene, trimethylsilyloxystyreneor 4-methoxytetrahydropyranyloxystyrene may be used as component (a1) or (a2.1).

Suitable components (a1) or (a2.1) are preferably also polymers or copolymers which contain both phenolic units and nonaromatic cyclic alcohol units (with p-hydroxycyclohexyl radicals). Futhermore, it is preferred that the phenolic units in the polymers or copolymers outnumber the nonaromatic cyclic alcohol units.

Particularly suitable are the commercially available polyvinylphenols from MARUZEN (eg. Lyncur PHM-C grades) which have been subsequently hydrogenated. These polymers can be reacted in polymer-analogous reactions so that the phenolic hydroxyl groups are completely or partially replaced by acid-labile ether, ester, acetal, ketal or carbonate groups.

The novel radiation-sensitive mixtures may contain, as component (b), also a sulfonate, in particular an alkylsulfonate of a compound having at least two phenolic hydroxyl groups or a disulfone.

The novel radiation-sensitive mixtures contain component (a) in an amount of from 80 to 99.5% by weight and component (b) in an amount of from 0.5 to 20% by weight, based on the total amount of components (a) and (b), and may additionally contain up to 2% by weight of an adhesion promoter, of a surf actant or of a colorant or a sensitizer which absorbs radiation and transmits it to component (b).

The present invention also relates to a process for the production of photosensitive coating materials using the novel radiation-sensitive mixture and a process for the production of relief structures by application of a novel radiation-sensitive mixture in a layer thickness of from 0.1 to 5 µm to a substrate pretreated in a conventional manner, drying at from 70 to 140° C., imagewise exposure, if necessary heating to 40–160° C., and development with an aqueous alkaline solution.

Relief structures having substantially improved contrast can be produced using the novel radiation-sensitive mixture. The high sensitivity, good resolution and easy processibility of the novel radiation-sensitive mixture are also noteworthy.

Regarding the components of the novel radiation-sensitive mixture, the following may be stated specifically.

Suitable strongly basic organic compounds (c) according to the invention are those having hydoxide, alkoxide or phenoxide anions. These compounds are based on, for example, quaternary ammonium salts whose anions are hydroxide, alkoxide or phenoxide. Preferred cations of the quaternary ammonium salts are all tetra-alkylammonium derivatives having identical or different substituents, for example tetramethyl-, tetraethyl-, tetra-n-propyl, tetra-n-butyl, vinyltrimethyl-, hexadecy- ltrimethyl- and trimethyl-(2-hydroxyethyl)-ammonium hydroxide. Quaternary ammonium salts containing aromatic groups, for example benzyltrimethylammonium or phenyltri-ethylammonium salts, are also preferred. Preferred specific compounds are tetramethylammonium hydroxide, tetraethylammonium hydroxide, tetra-n-propylammonium hydroxide, tetra-n-butyla=Lonium hydroxide, vinyltrimethylammonium hydroxide, hexadecyltrimethylammonium hydroxide, benzyltrimethylammonium hydroxide, benzyltrimethylammonium methylate, tetra-n-decylamionium hydroxide, cetylbenzyldimethylammoniumhydroxide, tetra-n-hexylammonium h ydroxide, tetra-n-octylammonium hydroxide, tributylmethylammonium hydroxide, triethylphenylammonium hydroxide, N-ethyl-N-dodecyl-N,N-dimethylammonium hydroxide, benzyltriethylammonium hydroxide or phenyltrimethylammonium hydroxide.

All organic bases having a $pK_b$ of <2.5 can be used according to the invention. Mixtures of strong bases according to the invention may likewise be used.

The component (c) is present in the novel radiation-sensitive mixture in an amount of from 0.01–50, preferably 1–20, mol %, based on component (b).

All conventional water-insoluble organic binders which contain acid-labile groups and whose solubility in aqueous alkaline developers increases as a result of the action of an acid can be used as component (a1) in the novel radiation-sensitive mixtures.

Suitable acid-labile groups are in particular ether, ester, acetal, ketal or carbonate groups. Ethers, such as tert-butyl ether, trimethylsilyl ether or tert-butyl dimethylsilyl ether, acetals, such as tetrahydropyranyl ether, and ketals, such as 4-methoxytetrahydropyranyl ether and 1-methyl 1-methoxyethyl ether, are preferred.

Particularly suitable water-insoluble organic binders (a1) whose solubility in aqueous alkaline developers increases as a result of the action of an acid are polymers or copolymers which contain, as monomer units, 4-hydroxystyrene, 2,6-dimethyl-4-hydroxystyrene, 2-methyl-4-hydroxystyrene, 4-hydroxy-alpha-methylstyrene, tert-butoxystyrene, tert-butoxycarbonyloxystyrene, tetrahydropyranyloxystyrene, tert-butyldimethylsilyloxystyrene, trimethylsilyloxystyrene or 4-methoxytetrahydropyranyloxystyrene. Suitable comonomers are furthermore all monomers which are copolymerizable with styrene, for example acrylates, methacrylates, sulfur dioxide and maleimides.

Polymers or copolymers (a1) containing both phenolic units and nonaromatic cyclic alcohol units are also preferred, particularly those in which the phenolic units outnumber the nonaromatic cyclic alcohol units. Such products are described, for example, in EP-A-0 401 499 and EP-A-0 534 324.

The polymeric binder (a1) is present in the novel mixture in general in an amount of from 80 to 99.5, preferably from 90 to 99, % by weight, based on the total amount of components (a1) and (b). The molecular weights ($\overline{M}_w$) of these homo- or copolymers are from 2,000 to 100,000, preferably from 4,000 to 35,000.

In addition, all binders of this type which are described in DE-A-4 007 924 and DE-A-4 202 845 are particularly preferred.

Suitable polymeric binders (a2.1) which are insoluble in water but soluble in aqueous alkaline solutions are polymers based on homo- or copolymers of 4-hydroxystyrene and/or 4-hydroxy-alpha-methylstyrene, particularly useful comonomer units being hydroxystyrenes which are mono- or disubstituted in the o-position with respect to the hydroxyl group or hydroxystyrenes whose phenolic group is protected with acid-labile groups. Particularly preferred acid-labile groups are ethers, such as tert-butyl ether, trimethylsilyl ether or tert-butyl dimethylsilyl ether, acetals, such as tetrahydropyranyl ether, esters, such as tert-butyl ester, and ketals, such as 4-methoxytetrahydropyranyl ether and 1-methyl-1-methoxyethyl ether. These comonomers units containing acid-labile groups are present only in amounts such that the polymeric binder (a2.1) is soluble in aqueous alkaline solutions. In general, 5–50 mol % are preferred for this purpose.

Polymeric binders (a2.1) containing both phenolic units and nonaromatic alcohol units, particularly polymers in which the phenolic units outnumber the nonaromatic alcohol units, are preferred. Suitable products can also be taken, for example, from EP-A-0 534 324.

The polymers (a2.1) have a molecular weight ($\overline{M}_w$) of from 2,000 to 100,000, preferably from 4,000 to 30,000.

Examples of organic compounds (a2.2) which contain acid-labile groups are:

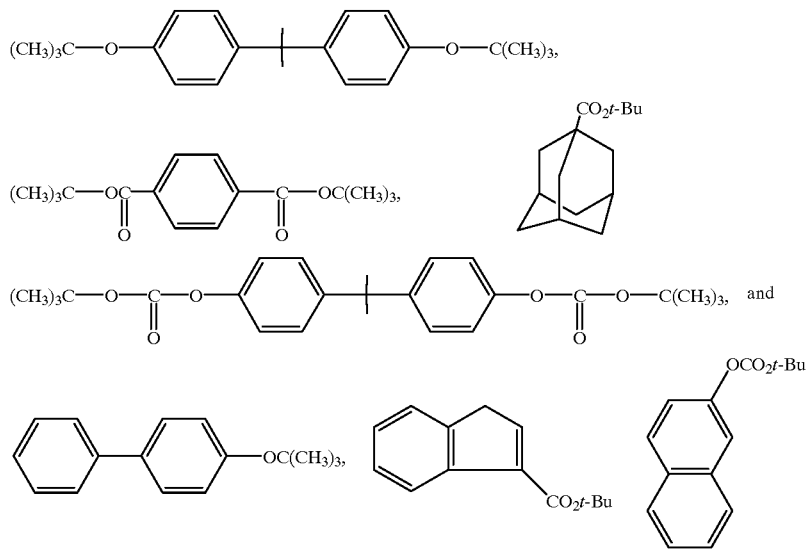

Nonpolymeric compounds which have at least one aromatic ring system with one or more tetrahydropyranyloxy substituents according to EP-A-0 475 903 are also useful, for example:

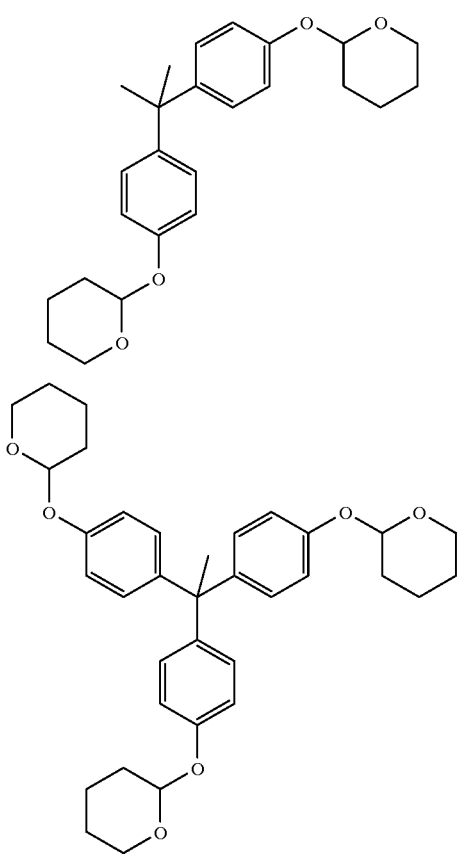

Suitable organic compounds which produce an acid under the action of actinic radiation (=acid donors) (b) are all photochemical acid donors known to the skilled worker.

Sulfonium or iodonium salts of the general formula (I) or (II)

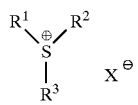  (I)

  (II)

where $R^1$, $R^2$ and $R^3$ are identical or different and are each straight-chain or branched alkyl of 1 to 18, preferably 1 to 6, carbon atoms, eg. methyl, ethyl, n-propyl, isopropyl, n-butyl, isobutyl, tert-butyl or hexyl, oxaalkyl having up to 3 oxygen atoms and up to 10 carbon atoms, aryl of 6 to 12 carbon atoms, eg. phenyl or naphthyl, $C_1$–$C_6$-alkyl- or $C_1$–$C_6$-alkoxy-substituted aryl, aralkyl, eg. benzyl, or a radical

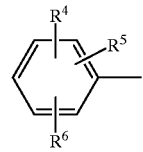

where $R^4$, $R^5$ and $R^6$ are identical or different and are each H, OH, halogen, alkyl of 1 to 18, preferably 1 to 6, carbon atoms, eg. methyl, ethyl, n-propyl, isopropyl, n-butyl, isobutyl, tert-butyl or hexyl, or alkoxy of 1 to 6 carbon atoms, eg. methoxy, ethoxy, propoxy or butoxy, and $X^\ominus$ is a nonnucleophilic counter-ion, are preferred.

Examples of suitable components (b) according to the general formulae (I) and (II) are triphenylsulfonium salts and diphenyliodonium salts as well as tris-(4-hydroxyphenyl)-sulfonium salts and bis-(4-hydroxyphenyl)-iodonium salts.

Particularly suitable sulfonium salts of the general formula (III)

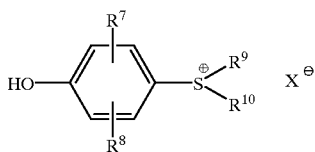

(III)

where $R^7$ and $R^8$ are identical or different and are each H, OH, alkyl of 1 to 18, preferably 1 to 6, carbon atoms, eg. methyl, ethyl, n-propyl, isopropyl, n-butyl, iso-butyl, tert-butyl or hexyl, or alkoxy of 1 to 6 carbon atoms, eg. methoxy, ethoxy, propoxy or butoxy, $R^9$ and $R^{10}$ are identical or different and are each alkyl of 1 to 18 carbon atoms and $X^{\ominus}$ is a nonnucleophilic counter-ion.

Examples of particularly advantageous sulfonium salts are 4-hydroxyphenyldimethylsulfonium and 3,5-dimethyl-4-hydroxyphenyldimethylsulfonium salts. Examples of suitable, nonnucleophilic anions are complex metal halides, such as tetrafluoborate, hexafluoroantimonate and hexafluoroarsenate, and strong organic anions, such as trifluoromethanesulfonate and fluorosulfonate.

The sulfonium salts of the general formula (IV)

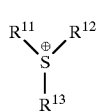

(IV)

where $R^{11}$, $R^{12}$ and $R^{13}$ are identical or different and are each aliphatic and/or aromatic radicals which may contain hetero atoms, or two of the radicals $R^{11}$ to $R_{936}$ are bonded to one another to form a ring, with the proviso that at least one of the radicals $R^{11}$ to $R^{13}$ contains at least one acid-cleavable group, preferably tert-butyl carbonates of phenols or silyl ethers of phenols, it being possible for one of the radicals $R^{11}$ to $R^{13}$ to be bonded, if necessary via acid-cleavable groups, to one or more further sulfonium salt radicals, and XI is a nonnucleophilic counter-ion.

Preferred counter-ions are complex metal halides, such as tetrafluoborate, hexafluoroantimonate and hexafluoroarsenate, and strong organic anions, such as trifluoromethanesulfonate (=triflate) and fluorosulfonate.

Two or more sulfonium units in the molecule may also be bonded via the radicals $R^{11}$ or $R^{12}$.

Preferred sulfonium salts of the general formula (IV) are those in which $R^{11}$ and $R^{12}$ are each methyl and $R^{13}$ is a substituted phenyl derivative having acid-cleavable groups, for example

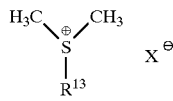

where $R^{13}$ is, for example, 4-tert-butoxycarbonyloxyphenyl, 4-tert-butoxycarbonyloxy-3,5-dimethylphenyl, 4-tert-butoxycarbonyloxy-3-methylphenyl, 4-tert-butoxycarbonyloxy-2-methylphenyl, 4-tert-butoxycarbonyloxy-3,5-dimethoxyphenyl, 4-tert-butoxycarbonyloxy-3,5-dimethylphenyl, 1-tert-butoxycarbonyloxynaphthyl, 4-trimethylsilyloxyphenyl or 4-trimethylsilyloxynaphthyl, or also those in which two of the radicals $R^{11}$ to $R^{13}$ are bonded to one another to form a ring, in particular a five-membered or six-membered ring, $R^{11}$ and $R^{12}$ being bridged, for example, to form tetramethylene groups and $R^{13}$ having the same meanings as above:

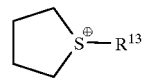

or compounds in which $R^{11}$ is methyl and $R^{12}$ is phenyl or tolyl and $R^{13}$ is a substituted phenyl derivative having acid-cleavable groups, where $R^{13}$ is 4-tert-butoxycarbonyloxyphenyl, 2,4-di-tert-butoxycarbonyloxyphenyl, 4-tert-butoxycarbonyloxy-2-methoxyphenyl or 4-trimethylsilylphenyl, or where $R^{11}$ is phenyl or $C_1$–$C_{12}$-alkyl-substituted phenyl or halogen-substituted phenyl and $R^{12}$ and $R^{13}$ are each a substituted phenyl derivative having acid-cleavable groups, where $R^{12}$ and $R^{13}$ are each, for example, 4-tert-butoxycarbonyloxyphenyl, 4-trimethylsilyloxyphenyl, 4-tert-butyldimethylsilyloxyphenyl or 4-tert-butoxycarbonyloxy-3,5-dimethylphenyl, or $R^{11}$, $R^{12}$ and $R^{13}$ are identical to one another, ie. are sulfonium salts which contain three of these radicals having acid-cleavable groups.

Preferred examples of compounds (b) are dimethyl-4-tert-butoxycarbonyloxyphenylsulfonium salts having hexafluoroarsenate, hexafluoroantimonate, hexafluorophosphate, hexafluoborate or trifluoromethanesulfonate as the counter-ion, phenylbis(4-tert-butoxycarbonyloxyphenyl) sulfonium salts having the stated counter-ions, tris(4-tert-butoxycarbonyloxyphenyl) sulfonium salts having the stated counter-ions or 1-naphthyl-4-trimethyl-silyloxytetramethylenesulfonium salts having the stated counter-ions.

Alkyloulfonates of compounds which contain at least two phenolic hydroxyl groups are also preferred as component (b). Examples of particularly suitable substances are 1,2,3-tris (methanesulfonyloxy) benzene and 1,3-bis (methanesulfonyloxy)benzene or disulfones, eg. diphenyl disulfone, 4-methoxyphenyl phenyl disulfone or bis(4-hydroxyphenyl) disulfone.

Mixtures of the compounds stated under (b) with themselves or with other organic photochemical acid donors not explicitly mentioned here can also be used. The total amount of all components (b) in the novel radiation-sensitive mixture is in general from 0.5 to 20, preferably from 1 to 10, % by weight, based on the sum of all components (a) and (b) in the radiation-sensitive mixture.

The novel radiation-sensitive mixture additionally can contain further, conventional prior art assistants and additives (sensitizers, colorants, leveling agents, wetting agents, stabilizers, etc.). These additives are introduced in general in amounts of less than 3% by weight.

For the production of resists, the novel mixtures are preferably dissolved in an organic solvent, the solids content usually being from 5 to 40% by weight. Preferred solvents are aliphatic ketones, ethers and esters, and mixtures thereof. Alkylene glycol monoalkyl ethers, for example ethylcellosolve, butylglycol, methylcellosolve and 1-methoxy-2-propanol, alkylene glycol alkyl ether esters, for example methylcellosolve acetate, methyl propylene glycol acetate and ethyl propylene glycol acetate, ketones, for example cyclohexanone, cyclopentanone and methyl ethyl ketone, and acetates, such as butyl acetate and ethyl acetate, other esters, such as ethyl lactate and butyrolactone, and aromatics, such as toluene and xylene, are particularly preferred. The choice of the corresponding solvents and mixtures thereof depends on the choice of the particular components of the radiation-sensitive mixture.

Other additives, such as adhesion promoters and plasticizers, may also be added, in general in amounts of up to 1% by weight.

The novel radiation-sensitive mixtures are sensitive to X-ray, electron radiation and UV radiation. If necessary, small amounts of the sensitizers may be added, for example pyrene and perylene, in order to sensitize the compounds in the longer wavelength UV to the visible wavelength range. High transparency of the layers at the particular exposure wavelength is required for exposure in specific wavelength ranges, for example in the short-wavelength UV range (<300 nm). In conventional exposure apparatuses based on mercury lamps, the 254 nm line is used, for excimer lasers which emit at 248 nm (KrF) are employed. The radiation-sensitive recording materials should therefore have very low optical densities in this range.

In the novel process for the production of positive relief patterns, a radiation-sensitive recording layer which essentially consists of the novel radiation-sensitive mixture is exposed imagewise to a dose such that the solubility of the exposed parts after postbake step at from 40 to 160° C. in aqueous alkaline solvents increases and these parts can be selectively removed with the alkaline developer.

The photoresist solutions containing the novel radiation-sensitive mixture are generally applied in layer thicknesses of from 0.1 to 5 µm, preferably from 0.5 to 1.5 µm, to suitable substrates, for example surface-oxidized silicon wafers, by spin coating, and are dried (for example at from 70 to 140° C.) and exposed imagewise to a photomask to a suitable light source (for example to short-wavelength UV radiation (deep UV) having wavelengths of from 200 to 300 nm. Particularly suitable light sources are excimer lasers of KrF (248 nm). After the imagewise exposure, and if necessary after a brief postbake at up to 160° C., development is effected using conventional aqueous alkaline developers, in general at a pH of from 12 to 14, the exposed parts being washed out. The resolution is in the submicron range. The exposure energy required for the novel radiation-sensitive mixtures is in general from 10 to 300 mJ/cm$^2$ at layer thicknesses of 1 µm.

The novel radiation-sensitive mixtures have high sensitivity, good resolution and good processibility and are therefore particularly advantageous for lithography in the short-wavelength range.

The novel radiation-sensitive mixtures with the addition of strong bases (c) having improved contrast compared with those without the addition of (c).

In the Examples which follow, parts and percentages are by weight, unless stated otherwise.

EXAMPLE 1

A photoresist solution was prepared from 5 parts of triphenylsulfonium triflate, 95 parts of poly-[4-hydroxystyrene-co-4-tert-butyldimethylsilyloxystyrene] (molar ratio of comonomers 7:3) and 300 parts of 1-methoxy-2-propanol. 5 mol %, based on the amount of triphenylsulfonium triflate, of tetra-n-butylammonium hydroxide were added. The solution was then filtered through a filter having a pore diameter of 0.2 µm.

This solution is applied in a layer of about 1 µm thick to surface-oxidized silicon wafers by spin coating, and the layer was heated for 1 minute at 90° C. After exposure through a structured test mask to excimer laser light of wavelength 248 nm, this wafer was subjected to postbaking at 70° C. for 1 minute and was developed with an aqueous alkaline developer (pH 12–13) for 1 minute.

The contrast of the resist, expressed by the gamma value ($\Gamma_p$), was determined by plotting the layer thickness against the exposure dose. For positive resist systems, the gamma value is defined as $$\Gamma_p = \left[\log\frac{D_1}{D_0}\right]^{-1}$$

where $D_0$ and $D_1$ are the extrapolated exposure energy doses from the energy curve for removal of material in the dark.

A gamma value $\Gamma_p$ of 7.3 was obtained.

EXAMPLE 2

The procedure was similar to that in Example 1, except that 10 mol %, based on the amount of triphenyl-sulfonium triflate, of tetra-n-butylammonium hydroxide were added.

A gamma value $\Gamma_p$ of 7.8 was obtained.

EXAMPLE 3

A photoresist solution was prepared from 7 parts of tris(4-tert-butoxycarbonyloxyphenyl)sulfonium triflate, 93 parts of poly-[4-hydroxystyrene-co-4-tert-butoxycarbonyloxystyrene] (molar ratio of comonomers 7.5:2.5) and 350 parts of methoxypropyl acetate. 5 mol %, based on the amount of tris(4-tert-butoxycarbonyloxyphenyl)sulfonium triflate, of tetra-n-butylammonium hydroxide were added.

After a treatment similar to that in Example 1 but with postbake of 90° C. after the exposure, a gamma value $\Gamma_p$ of 9.5 was measured.

EXAMPLE 4

The procedure was as in Example 3, except that 10 mol %, based on the amount of tris(4-tert-butoxycarbonyloxyphenyl)sulfonium triflate, of tetra-n-butylammonium hydroxide were added.

A gamma value $\Gamma_p$ of 9.6 was obtained.

EXAMPLE 5

A photoresist solution was prepared from 4 parts of 4-hydroxyphenyldimethylsulfonium triflate, 96 parts of poly-[4-hydroxystyrene-co-4-tetrahydropyranyloxystyrene] (molar ratio of the comonomers 7:3) and 300 parts of ethyl lactate. 3 mol %, based on the amount of 4-hydroxyphenyldimethylsulfonium triflate, of tetramethylammonium hydroxide were added.

After a treatment similar to that in Example 3, a gamma value $\Gamma_p$ of 6.8 was obtained.

EXAMPLE 6

In a procedure similar to Example 5, 20 mol % of tetramethylammonium hydroxide were added to the photoresist solution described there, and a gamma value $\Gamma_p$ of 7.9 was obtained.

EXAMPLE 7

A photoresist solution was prepared from 2 parts of tris(4-tert-butoxycarbonyloxyphenyl)sulfonium triflate, 3 parts of tris(methanesulfonyloxy)benzene, 95 parts of poly-[4-hydroxystyrene-co-4-tert-butoxycarbonyloxystyrene] (molar ratio of the comonomers 7.5:2.5) and 300 parts of methoxypropyl acetate. 5 mol %, based on the amount of tris(4-tert-butoxycarbonyloxyphenyl)-sulfonium triflate, of tetramethylammonium hydroxide were added.

After a treatment similar to that in Example 3, a gamma value $\Gamma_p$ of 6.5 was measured.

EXAMPLE 8

In a procedure similar to Example 7, 10 mol % of tetramethylammonium hydroxide were added to the photoresist solution described there and a gamma value $\Gamma_p$ of 6.5 was obtained.

EXAMPLE 9

A photoresist solution was prepared from 4 parts of tris(4-hydroxyphenyl)sulfonium triflate, 96 parts of poly-[4-hydroxystyrene-co-4-trimethyluilyloxystyrene] (molar ratio of the comonomers 7:3) and 300 parts of ethyl lactate. 5 mol %, based on the amount of tris(4-hydroxyphenyl)sulfonium triflate, of benzyltrimethylammonium methylate were added.

After a treatment similar to that in Example 3, a gamma value $\Gamma_p$ of 7.5 was measured.

EXAMPLE 10

In a procedure similar to Example 9, 10 mol % of benzyltrimethylammonium methylate were added to the photoresist solution described there, and a gamma value $\Gamma_p$ of 7.3 was obtained.

COMPARATIVE EXAMPLE 1

A photoresist solution was prepared from 5 parts of triphenylsulfonium triflate, 95 parts of poly-[4-hydroxystyrene-co-4-tert-butyldimethylsilyloxystyrene] (molar ratio of the comonomers 7:3) and 300 parts of 1-methoxy-2-propanol.

After a treatment similar to that in Example 1, a gamma value $\Gamma_p$ of 3.5 was obtained.

COMPARATIVE EXAMPLE 2

A photoresist solution was prepared from 7 parts of tris(4-tert-butoxycarbonyloxyphenyl)sulfonium triflate, 93 parts of poly-[4-hydroxystyrene-co-4-tert-butoxycarbonyloxystyrene] (molar ratio of the comonomers 7.5:2.5) and 350 parts of methoxypropyl acetate. After a treatment similar to that in Example 3, a gamma value $\Gamma_p$ of 4.9 was obtained.

COMPARATIVE EXAMPLE 3

A photoresist solution was prepared from 4 parts of 4-hydroxyphenyldimethylsulfonium triflate, 96 parts of poly-[4-hydroxystyrene-co-4-tetrahydropyranyloxystyrene] (molar ratio of the comonomers 7:3) and 300 parts of ethyl lactate.

After a treatment similar to that in Example 3, a gamma value $\Gamma_p$ of 3.7 was obtained.

COMPARATIVE EXAMPLE 4

A photoresist solution was prepared from 2 parts of tris(4-tert-butoxycarbonyloxyphenyl)sulfonium triflate, 3 parts of tria(methanesulfonyloxy)benzene, 95 parts ofpoly-[4-hydroxystyrene-co-4-tert-butoxycarbonyloxystyrene] (molar ratio of the comonomers 7.5:2.5) and 300 parts of methoxypropyl acetate.

After a treatment similar to that in Example 7, a gamma value $\Gamma_p$ of 2.5 was obtained.

COMPARATIVE EXAMPLE 5

A photoresist solution was prepared from 4 parts of tris(4-hydroxyphenyl)sulfonium triflate, 96 parts of poly-[4-hydroxystyrene-co-4-trimethyloxystyrene] (molar ratio of the comonomers 7:3) and 300 parts of ethyl lactate.

After a treatment similar to that in Example 9, a gamma value $\Gamma_p$ of 4.0 was obtained.

EXAMPLE 11

A polymer having phenolic units and nonaromatic cyclic alcohol units (eg. polyvinylphenol from MARUZEN under the name of Maruka Lyncur PHM-C, having a molecular weight of 5,000±500 and a degree of hydrogenation of at most 13%) was reacted with dihydropyran, causing about 40% of the phenolic hydroxyl groups to be converted into tetrahydropyranyl units. A photoresist solution was prepared from 96 parts of this polymer, 4 parts of 4-hydroxyphenyldimethylsulfonium triflate and 300 parts of ethyl lactate. 2 mol % of tetramethylammonium hydroxide, based on the amount of 4-hydroxyphenyldimethylsulfonium triflate were added. After a treatment similar to that in Example 3, a gamma value $\Gamma_p$ of 7.6 was obtained.

We claim:

1. A positive-working radiation-sensitive mixture, consisting essentially of
   (a1) a water-insoluble organic binder which contains acid labile groups and is rendered soluble in aqueous alkaline solutions by the action of an acid, or
   (a2.1) a polymeric binder which is insoluble in water but soluble in aqueous alkaline solutions and
   (a2.2) an organic compound whose solubility in a aqueous alkaline developer is increased by the action of an acid,
   (b) an organic compound which produces an acid under the action of actinic radiation, and
   (d) optionally a sensitizer which absorbs ultraviolet radiation and transmits it to component (b), wherein
   (c) at least one strongly basic organic quaternary ammonium hydroxide, alkoxide or phenoxide having a $pK_b$ of <2.5 in an amount of at least 5 mol % and not more than 50 mol % based on component (b) is present and component (b) is a sulfonium salt of the formula (I)

$$\begin{array}{c} R^1 \quad R^2 \\ \diagdown \quad \diagup \\ S^+ \quad X^- \\ | \\ R^3 \end{array} \quad (I)$$

where
   $R^1$, $R^2$ and $R^3$ are identical or different and are alkyl, oxaalkyl, aryl, alkyl- or alkoxy-substituted aryl or a radical $$\begin{array}{c} R^4 \\ R^5 \\ R^6 \end{array}$$

where $R^4$, $R^5$ and $R^6$ are identical or different and are H, OH, halogen, alkyl or alkoxy and
   $X^-$ is a non-nucleophilic counter-ion.

2. A radiation-sensitive mixture as defined in claim 1 wherein component (b) used is a sulfonium salt of the formula (III)

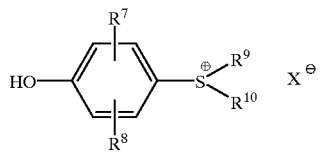

(III)

where $R^7$ and $R^8$ are identical or different and are each H, OH, alkyl or alkoxy, $R^9$ and $R^{10}$ are identical or different and are each alkyl of 1 to 18 carbon atoms and $X^\ominus$ is a nonnucleophilic counter-ion.

3. A radiation-sensitive mixture as defined in claim 1 wherein at least one of the components (a1) or (a2.1) and (a2.2) contain acid-labile ether, ester, acetal, ketal or carbonate groups.

4. A radiation-sensitive mixture as defined in claim 1, wherein polymers or copolymers which contain, as monomer units, tert-butoxystyrene, tert-butoxycarbonyloxystyrene, tetrahydropyranyloxystyrene, tert-butyldimethylsilyloxystyrene, trimethylsilyloxystyrene or 4-methoxytetrahydropyranyloxystyrene are used as component (a1) or (a2.1).

5. A radiation-sensitive mixture as defined in claim 1, wherein the component (a) is present in an amount of from 80 to 99.5% by weight and component (b) is present in an amount of from 0.5 to 20% by weight, based on the total amount of components (a) and (b).

6. A radiation-sensitive mixture as defined in claim 1 which additionally contains up to 2% by weight of an additive selected from the group consisting of an adhesion promoter, a surfactant and a colorant based on the total amount of (a)+(b)+additive.

7. A radiation-sensitive mixture as defined in claim 1 which additionally contains up to 2% by weight of a sensitizer which absorbs ultraviolet radiation and transmits it to component (b) based on the total amount of (a)+(b)+sensitizer.

8. A process for the production of relief structures which comprises:

A) applying the radiation sensitive mixture defined in claim 1 to a substrate in a layer thickness of from 0.1 to 5 μm, B) drying the coated substrate at from 70 to 140° C., C) imagewise exposing the dried and coated substrate to ultraviolet radiation, D) heating the exposed, dried and coated substrate to 40–160° C., and E) developing the substrate of step D) with an aqueous alkaline solution.

9. A process for the production of relief structures which comprises:

A) applying the radiation sensitive mixture of claim 1 to a substrate in a layer thickness of from 0.1 to 5 μm, B) drying the coated substrate at from 70 to 140° C., C) imagewise exposing the dried and coated substrate to ultraviolet radiation, and D) developing the substrate formed in step C) with an aqueous alkaline solution.

10. A positive-working radiation-sensitive mixture, consisting essentially of (a1) a water-insoluble organic binder which contains acid labile groups and is rendered soluble in aqueous alkaline solutions by the action of an acid, or (a2.1) a polymeric binder which is insoluble in water but soluble in aqueous alkaline solutions and (a2.2) an organic compound whose solubility in a aqueous alkaline developer is increased by the action of an acid, and (b) an organic compound which produces an acid under the action of actinic radiation, wherein (c) at least one strongly basic organic quaternary ammonium hydroxide, alkoxide or phenoxide having a $pK_b$ of <2.5 in an amount of at least 5 mol % and not more than 50 mol % based on component (b) is present and component (b) is a sulfonium salt of the formula (IV)

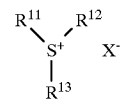

(IV)

where $R^{11}$, $R^{12}$ and $R^{13}$ are identical or different and are each alkyl, oxaalkyl, aryl or alkyl-substituted or alkoxy-substituted aryl or aralkyl, or two of the radicals $R^{11}$ and $R^{13}$ are bonded to one another to form a ring, wherein at least one of the radicals $R^{11}$ to $R^{13}$ contains at least one acid-cleavable group, and wherein one of the radicals $R^{11}$ to $R^{13}$ may be bonded to one or more further sulfonium salt radicals, and $X^-$ is a non-nucleophilic counter-ion.

11. The mixture of claim 10, wherein one of the radicals $R^{11}$ to $R^{13}$ is bonded to one or more further sulfonium salt radicals.

12. The mixture of claim 10, wherein one of the radicals $R^{11}$ to $R^{13}$ is bonded to one or more further sulfonium salt radicals via acid cleavable groups.

* * * * *